July 8, 1958 J. W. MOYER 2,842,466

METHOD OF MAKING P-N JUNCTION SEMICONDUCTOR UNIT

Filed June 15, 1954

Inventor:
James W. Moyer,
by Paul A. Frank
His Attorney.

United States Patent Office 2,842,466

Patented July 8, 1958

2,842,466

METHOD OF MAKING P-N JUNCTION SEMICONDUCTOR UNIT

James W. Moyer, Schenectady, N. Y., assignor to General Electric Company, a corporation of New York Application June 15, 1954, Serial No. 436,816

4 Claims. (Cl. 148—1.5)

My invention relates to P–N junction semiconductor units and to methods of making such P–N junction units.

A P–N junction semiconductor unit is a semiconductor crystal having a positive or "P-type" conductivity zone or region adjoining a negative or "N-type" conductivity zone or region. The junction between these opposite conductivity regions of the crystal is called a P–N junction. The determinant of whether a particular region of the crystal has P-type or N-type conductivity characteristics lies in the type and amount of minute traces of significant activator elements for the semiconductor involved. Some activators, conventionally called "donors," function to furnish additional free electrons to the region of the crystal which they impregnate, thus inducing negative or N-type conductivity characteristics therein. Phosphorus, arsenic, and antimony are examples of such donor activators. Other significant activators, conventionally called "acceptors," function to absorb electrons from the semiconductor atoms in the region which they impregnate, thereby to induce positive or P-type conductivity characteristics therein. Indium, gallium, and aluminum are examples of such acceptor activators.

Such P–N junction semiconductor units have been found to exhibit marked photosensitive, thermosensitive, and asymmetrically conductive properties making them useful in many different types of devices such as rectifiers, transistors, photoelectric, photoconductive, and thermoconductive cells. For certain applications, principally in photosensitive and thermosensitive devices, it is highly desirable that the P–N junction be formed very close to the surface of the P–N junction unit in order that the junction may receive the maximum impingement of incident light or heat radiation. In other applications, principally in high frequency rectifiers, transistors, and photocells, it is desirable that there be a gradual change in electrical charge distribution across the junction region, thereby providing low junction capacitance.

In making such P–N junction units, it is, of course, highly desirable that the concentration and gradient of the activator elements therein be accurately and reproducibly controlled, and that the location and charge gradient across the junction be reproducibly controllable.

Accordingly, one object of the invention is to provide a P–N junction semiconductor unit in which the P–N junction is located extremely close to the surface of the unit and a new method of making such P–N junction units.

Another object of the invention is to provide a new method for making P–N junction units in which the location of the P–N junction near the surface can be adjustably and predictably controlled to have any desired depth.

Another object of the invention is to provide a new method for making P–N junction units whereby the activator element concentration and gradient in the junction region can be accurately and adjustably controlled.

A further object of the invention is to provide a new method of making P–N junction units which is amenable to mass production techniques.

In general, in accord with my new method of making P–N junctions, I bombard a semiconductor crystal of one conductivity type with ions of an activator element of an opposite conductivity inducing type. The ions of the activator element penetrate slightly below the surface of the semiconductor crystal and convert the region within which they penetrate into semiconductor material having an opposite conductivity type than the main body of the semiconductor crystal. By controlling such parameters as the velocity and density of bombarding ions and the time of ionic bombardment it is possible to regulate the location and charge gradient of the P–N junction formed beneath the surface of the crystal. Similarly the activator element concentration and hence the resistivity of the converted activator-ion-impregnated surface region may be closely regulated. The resulting P–N junction units differ from conventional type P–N junction units in that the junction may be formed extremely close to the surface of the crystal, for example, from between 50 to 500 atomic diameters below the surface, as well as in the fact that the activator ions are present in greater concentration near the junction than at the surface of the semiconductor crystal.

In accord with another feature of the invention, P–N junctions may be formed beneath the surface of the semiconductor crystal in any desired pattern by merely masking the portions of the ion-bombarded surface where it is desired that no P–N junction should be produced.

In accord with a further feature of the invention, an electrode may be formed upon and secured to the surface of the ion-bombarded unit overlying the P–N junction by an evaporation step which permits the utilization of the same activator element and/or the same or similar apparatus as that used for the ionic bombardment.

The novel features believed characteristic of the invention are set forth in the appended claims. The invention itself, however, together with further objects and advantages thereof may best be understood by referring to the following description taken in connection with the accompanying drawing, in which:

Fig. 1 illustrates an ion gun useful in practicing the invention;

Fig. 2 is an enlarged view of a P–N junction unit made in accord with the invention;

Fig. 3 is an enlarged view of a photoconductive cell embodying the invention;

Fig. 4 is an exploded diagrammatic view of masking apparatus useful in practicing a further technique in accord with the invention whereby localized P–N junctions of any desired configuration may be formed in a semiconductor crystal; while Fig. 5 illustrates a P–N–P junction transistor embodying a P–N junction unit made in accord with the masking technique illustrated by Fig. 4.

Figures 1, 2, 3, 4, 5:
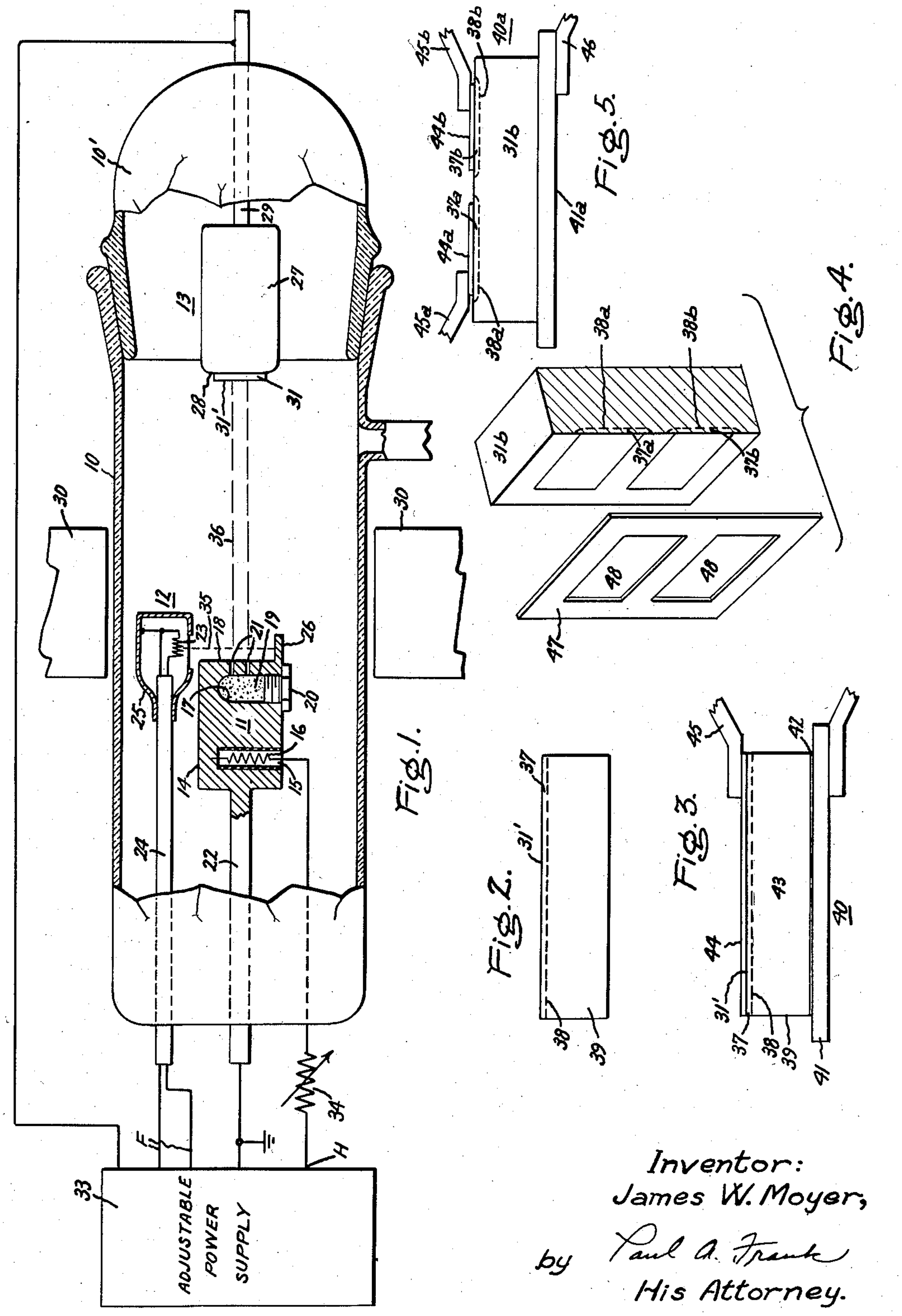

In Figure 1, apparatus for practicing the invention is shown in one form as comprising an evacuable glass or quartz envelope 10 in which is located an evaporator 11, an ionizing gun 12, and a target electrode 13. Evaporator 11 comprises a metal or other heat conducting block 14 in which is embedded a heating element 15 comprising a resistance wire filament 16 connected at one end to block 14 but electrically insulated along its length from the walls of the block within which it is embedded. A cavity or recess 17 is formed adjacent the front face 18 of block 14 within which a charge 19 in the form of small particles of an activator element are placed. The mouth of cavity 17 is then sealed with a suitable plug or screw 20. A plurality of apertures 21 lead from the front surface 18 of block 14 into cavity 17 through which vaporized atoms or molecules of the charge 19 escape. Evaporator 11 is supported within envelope 10 upon a conducting stem or rod 22 hermetically sealed through a wall of the envelope 10.

Electron gun 12 comprises a thermionic filament 23 whose current supplying leads are embedded within an insulating supporting rod 24 hermetically sealed through the wall of envelope 10. A metal electron beam confining and focusing shield 25 is attached to rod 24 and preferably surrounds filament 23 on three sides, thus allowing the emanation of electrons therefrom only in a direction along the front surface 18 of evaporator 11. The electron beam 35 emanating from the filament 23 is collected upon a metal target 26 projecting from the bottom end of evaporator 11. Suitable focusing magnets or electromagnets 30 are preferably provided on opposite sides of envelope 10 as indicated in order to help focus and direct electron beam 35 across apertures 21.

Target electrode 13 comprises a heat conducting metal block 27 supported on a metal conducting rod 29 within envelope 10 with its front surface 28 in a position to receive a beam of ions emanating from evaporator 11. The end portions 10' of envelope 10 which supports target electrode 13 is preferably made easily disconnectable, for example, with a tapered seal as shown.

In practicing the invention a semiconductor crystal 31 of one conductivity type, for example, N-type germanium or silicon, is attached to or held upon the ion beam receiving end surface 28 of target electrode 13. Crystal 31 is preferably in the form of a flat wafer as shown but may take other desired configurations. Semiconductor crystal 31 is preferably monocrystalline and substantially free of all electrically significant impurities other than those from which its conductivity characteristic is derived. More specifically, semiconductor crystal 31 preferably has less than $10^{15}$ atoms per cubic centimeter of total impurities and less than $10^{14}$ atoms per cubic centimeter of conductivity determining impurities such as donor activators for N-type conductivity characteristics.

A charge 19, of an activator element of opposite conductivity inducing type, is then placed within recess 17 of evaporator 11. If semiconductor crystal 31 constitutes N-type germanium or silicon, for example, activator element 19 must be an acceptor activator and may, for example, constitute indium or gallium. If crystal 31 constitutes P-type germanium or silicon, for example, the activator element 19 must be a donor activator and may, for example, constitute aluminum, arsenic, or antimony. The activator element 19 is preferably in the form of small particles or pieces for quick heating and evaporation thereof.

Envelope 10 is evacuated by connection to a suitable vacuum system, not shown. Operating voltages are supplied to the various components of the ion gun 9 of Fig. 1 by means of a suitable adjustable power supply indicated as block 33. The evaporator block 14 is held at ground potential and a suitable heating current supplied to heater 15 through a temperature controlling resistance 34 by connection to a heating voltage supplied at terminal H of power supply 33. Thermionic filament 23 is maintained at a substantially negative voltage relative to the metal block 14 of evaporator 11, for example, at −500 volts in order that a beam of electrons 35 will be accelerated from filament 23 along the front face 18 of evaporator 11. Voltage for heating filament 23 is supplied from terminals F of the adjustable power supply 33. A high, adjustable, ion-accelerating voltage as, for example, from −5 kilovolts to −50 kilovolts, is delivered from power supply 33 to connecting rod 29 and thence to target electrode 13. It will be appreciated, of course, that the above voltages are illustrative only and will vary considerably depending upon the type and construction of the ionization gun employed.

In the operation of ion gun 9, the activator element 19 is heated within evacuated envelope 10 until the activator element vaporizes and is evaporated through holes 21 into the region traversed by electron beam 35. The atoms of evaporated activator element are ionized by the bombardment of electron beam 35, and the resulting positively charged ions accelerated at high velocity in the form of an ion beam 36 toward target electrode 13 under the influence of the electrostatic field between evaporator 11 and target electrode 13 as a result of the high negative voltage applied to the target electrode. Ion beam 36 impinges upon the exposed surface of semiconductor crystal 31 at a velocity depending upon the accelerating potential supplied to the target electrode 13, and with an ion current intensity depending primarily upon the rate of evaporation of the activator element from evaporator 11.

The impinging ion beam 36 penetrates within a surface-adjacent region 37 of semiconductor crystal 31 to a depth and extent depending upon the velocity of the incident ions, and converts ion-impregnated surface-adjacent region 37 into a conductivity type opposite to that of the remainder of the body of the crystal. A P–N junction 38 as seen in Fig. 2 is thus formed at or near the limit of the activator-ion penetration. Because of the nature of the ionic bombardment, the penetration is, of course, limited to the region very close to the surface of the semiconductor crystal, ordinarily less than 500 atomic diameters deep. The velocity of ion bombardment should be kept below a value at which atoms of the semiconductor material are ejected from the crystal, but should be great enough so that the activator ions penetrate below the surface of the crystal. For most present ion guns, these limitations correspond to an electrostatic accelerating field of from 5 kilovolts to about 50 kilovolts in magnitude, resulting in a depth of activator ion penetration of from 100 to 1,000 Angstrom units.

The ion bombardment must be continued for a period long enough for the number of activator ions penetrating into the surface-adjacent region 37 to be sufficient to compensate for, and exceed, the activator elements of opposite conductivity type initially present in the semiconductor crystal. For example, if N-type germanium having approximately $10^{14}$ atoms of donor activator per cubic centimeter is employed for the semiconductor crystal 31 then it is necessary that the semiconductor crystal 31 be exposed to ion irradiation of sufficient magnitude and for a sufficient time to impregnate surface-adjacent region 37 with over $10^{14}$ atoms per cubic centimeter of acceptor activator ions. Preferably, the ion bombardment is continued for a period of time sufficient to impregnate surface-adjacent layer 37 with an excess of impregnating activator ions of at least $10^{13}$ ions per cubic centimeter and preferably over $10^{14}$ ions per cubic centimeter. A heavier dosage of ion impregnation, however, does not appear adversely to affect the desired asymmetrically conductive or photosensitive and thermosensitive properties of the resulting P–N junction unit. Sufficient ion impregnation is achieved by subjecting the crystal to an ion bombardment current of a few microamperes for at least 30 seconds and preferably for a few minutes.

Under certain conditions of high ion-acceleration potential and ion current, the values of which vary with the semiconductors being bombarded, the ion bombardment may cause crystal lattice defects which favor the formation of P-type semiconductor crystal structure. Such lattice defects may be readily removed by annealing. The bombarded surface 31' of semiconductor crystal 31 may first be cleaned in a chemical or electrolytic etch, as for example, by dipping in concentrated nitric acid. The crystal may then be annealed for several hours at an elevated temperature substantially less than the melting point of the crystal involved. When an N-type semiconductor crystal is bombarded with acceptor impurity ions to form a P–N junction therein the presence of lattice defects within the bombarded surface-adjacent region does not greatly affect the P-N junction formed therein. Therefore, in this case, the etching and annealing steps are not essential, although they do enhance the asymmetrical, photoconducting and thermoconducting properties of the resulting P–N junction unit. When, however, a P-type semiconductor crystal is bombarded with donor impurity activator ions to form a P–N junction therein, the presence of P-type favoring lattice defects may make the formation of an N-type surface-adjacent region difficult, if not impossible. For this reason, if the bombarding ionic beam forms such lattice defects within the surface-adjacent region of an originally P-type semiconductor, the semiconductor device must be properly annealed in order that it attain the desired asymmetrical, photoconducting, and thermoconducting properties. It is to be understood, however, that the occurrence of such lattice defects does not always accompany the formation of P–N junctions within semiconductor crystals by ion bombardment, but rather, may occur if ionic current density and ion accelerating potential are sufficiently high as to affect the lattice structure of the crystal involved.

If the accelerating voltage applied to target electrode 13 is kept at a fairly constant value, the ion penetration within surface-adjacent region 37 is fairly uniform over the entire surface area, forming a well-defined P–N junction layer 37 at the maximum depth of penetration. The impregnating activator ions (which, of course, become atoms within the crystal) are present in greater concentration immediately adjacent the P–N junction 37 than at the surface 31'. This results in a very sharp impurity gradient across the junction region 37 thereby providing a unit with fairly high break-down voltage characteristics in the reverse direction of current flow, but with fairly high capacitance. The fact that the resulting P–N junction unit has greater concentration of impregnated activator ions near the junction than at the surface distinguishes these units from P–N junction units made by conventional fused and diffused contact techniques, such as described, for example, in Patent 2,644,852—Dunlap. In such fused and diffused contact units, the activator-impregnated region is far more heavily impregnated near the surface of the semiconductor crystal than near the generated P–N junction.

Where it is desired that the impregnated activator ion concentration have a more gradual gradient characteristic, thereby producing a more gradual charge distribution across the junction, it is necessary only to modulate the accelerator voltage applied to target electrode 13 during the ion bombardment step. The modulation may, for example, be from −10 to −50 kilovolts at a low frequency of a few, for example, 2 cycles per second. The velocity of impinging activator ions is thereby modulated accordingly, and the distances to which the ions penetrate into the semiconductor surface-adjacent region 37 varied correspondingly.

Several examples of the practice of the invention will now be given. An N-type germanium crystalline wafer having a thickness of 0.020 inch and a purity corresponding to a resistivity of 7 ohm centimeters is subjected to bombardment by ions of indium under an accelerating field of −40 kilovolts at a current of 2 micro-amperes for two minutes. A P–N junction is found to be formed at a depth of the order of 100 atomic diameters, i. e., between 500 and 1,000 Angstrom units below the bombarded surface. Units of this type have fairly good rectification characteristics even before etching and annealing, showing a reverse leakage current of only about 5 milliamperes per square centimeter for a reverse applied voltage of 1 volt while passing over 100 milliamperes per square centimeter at a forward voltage drop of 1 volt. In the above example, indium ions are formed by heating particles of indium in the evaporator 11 to a temperature of 250° C. and subjecting the evolved indium vapor to an electron beam accelerated by 350 volts, and focused by an external magnetic field from magnets 30, of about 800 gauss.

In another example, an N-type germanium crystal of the same purity as the wafer of the preceding example is bombarded with indium ions evaporated from the furnace heated to 600° C. under an accelerating voltage of 44 kilovolts to provide an ion current of 3 microamperes maintained for 2 minutes. The P–N junction unit produced is then etched in 50 percent nitric acid and annealed at 500° C. for 12 hours. When tested, units of this type are found to have better asymmetrically conductive characteristics than similar units that were neither etched nor annealed.

In a further example, P-type germanium of similar high purity is bombarded with an arsenic ion current of approximately 1 micoampere for 2 minutes under an accelerating field of 40 kilovolts, arsenic being a donor type activator. The evaporator is elevated to a temperature of 250° C. giving a vapor pressure of arsenic of approximately 1 micron. The bombarded crystal is then etched in concentrated nitric acid and annealed at 400° C. in vacuo for 12 hours. The bombarded region of the crystal is found to have N-type conductivity, while the remainder of the body retains its initial P-type conductivity characteristics.

As a still further example, a substantially pure, P-type silicon crystal is bombarded with antimony ions (antimony being a donor activator) with an ion current of about 3 microamperes at 50 kilovolts for about 8 minutes. A P–N junction unit is formed even without etching and annealing.

In Fig. 3, there is shown a photoconductive cell 40 embodying a P–N junction unit made in accord with the invention. Photoconductive cell 40 comprises a metal, for example, fernico, plate 41, soldered in good electrically conductive contact by means, for example, of an antimony solder 42, to the unexposed surface of the N-type zone 43 of the P–N junction unit 39. Terminal lead 41a may be soldered or otherwise fastened to plate 41. P–N junction unit 39 constitutes an N-type germanium crystal of which the surface-adjacent region 37 has been bombarded with indium activator ions in the manner described above in connection with Figs. 1 and 2. A suitable thin metallic film 44 as for example silver or aluminum is plated, evaporated or otherwise spread over the bombarded surface 31' of activator ion impregnated region 37. A suitable terminal lead 45 is then soldered or otherwise connected to this metallic electrode film 44. Electrode film 44 is preferably made quite thin in order to provide minimum impedance to incident light. Photoconductive cell 40 functions to vary the current flowing in an external circuit connected in the reverse direction of current flow between terminals 45 in response to the intensity of light penetrating through metallic electrode film 44 and through the activator ion impregnated surface-adjacent region 37 upon the P–N junction 38 of P–N junction unit 39.

In accord with a further feature of the invention, metallic electrode film 44 may be applied to the exposed surface 31' of semiconductor crystal 31 by an evaporation step, for example, in the same apparatus as that employed for the ionic bombardment of crystal 31. More specifically, for mass production techniques, the semiconductor crystal 31 is first bombarded with suitable activator ions in an apparatus such as disclosed in Fig. 1 and then removed together with end section 10' of envelope 10, dipped into a suitable etchant, and, if desired, annealed, and then placed on the end of an evaporating apparatus identical to that shown in Fig. 1 but without the electron gun 12 or magnets 30. The activator element is then evaporated upon the exposed surface 31′ of the previously bombarded surface-adjacent region 37 of crystal 31. It is preferable that the ion gun 9 not be used for the evaporation step because the simple evaporation of the material without the formation into an ion beam causes an evaporation of the material on the exposed surface of the electron gun, as well as upon the inner walls of envelope 10. If it is desired to use ion gun 9 to produce metallic electrode film 44, it is preferable merely to reduce the accelerating voltage supplied to target electrode 13 to a lower value, as for example, 1,000 volts, after the ion bombarding step. In this way, a weak ion beam is produced which coats the exposed surface 31′ of the previously bombarded surface-adjacent region 37 rather than penetrating thereinto.

In accord with a further feature of the invention, P–N junctions of any desired configuration may be formed upon a semiconductor body by placing a suitable mask over the body which is to be bombarded. Fig. 4 illustrates one arrangement whereby two or more separate P–N junctions may be formed within separate surface-adjacent portions of a semiconductor body. As illustrated in Fig. 4 (an exploded view) a suitable mask 47 having openings 48 therein corresponding to the desired P–N junction configurations may be placed over and temporarily fastened to semiconductor body 31*b* as, for example, by soldering. The assembly comprising semiconductor body 31*b* and mask 47 may then be attached or fastened to target electrode 13 and the ion bombardment process carried on as described in conjunction with Fig. 1. After suitable ion bombardment, as described hereinbefore with respect to semiconductor body 31, semiconductor body 31*b* is removed from target electrode 13, and the mask 47 removed therefrom. Semiconductor body 31*b* may then be etched and annealed, if desired, as described hereinbefore with respect to semiconductor body 31, to enhance the thermoconductive, photoconductive and asymmetrically conducting properties of P–N junctions 38*a* and 38*b* formed within surface-adjacent regions 37*a* and 38*b* respectively, of semiconductor body 31*b* by the bombardment and penetration of suitable activator ions. As with respect to semiconductor body 31, P–N junctions 38*a* and 38*b* may be formed within surface-adjacent regions 37*a* and 37*b* respectively by the bombardment with high velocity donor activator ions as, for example, phosphorus, antimony or arsenic if semiconductor body 31*b* displays P-type conduction characteristics. If, on the other hand, semiconductor body 31*b* displays N-type conductivity characteristics, P–N junctions 38*a* and 37*b* may be formed by bombardment with high velocity acceptor activator ions as, for example, aluminum, gallium, or indium.

According to the method of forming, by activator ion bombardment, a plurality of P–N junctions upon the same surface of a semiconductor body, as described in conjunction with Fig. 4, a further feature of the invention involves the formation of junction type transistors by activator ion bombardment. One such transistor is shown and denominated generally as 40*a* in Fig. 5. Transistor 40*a* may be either N–P–N type or P–N–P type depending upon the original conduction characteristics of semiconductor body 31*b*. Transistor 40*a* is composed of a semiconductor body 31*b* preferably monocrystalline in structure, into which have been induced P–N junctions 38*a* and 38*b* by activator ion bombardment according to the method hereinbefore described in conjunction with Figs. 1 and 4, and low resistance contact electrodes 41*a*, 44*a*, and 44*b*. If, for example, semiconductor body 31*b* possessed N-type conduction charactertistics before ion bombardment, the region of body 31*b* adjacent electrode 41*a* will remain N-type, and electrode 41*a* may conveniently be, for example, fernico soldered to body 31*b* with antimony solder. If, for example, P–N junctions 38*a* and 38*b* are formed by bombardment with indium ions, electrodes 44*a* and 44*b* may conveniently constitute evaporated indium, which may be applied to surface-adjacent regions 37*a* and 37*b* in envelope 10 as hereinbefore described with reference to Fig. 3, or by other means well known to the art. Terminal leads 45*a*, 45*b*, and 46*c* may conveniently be soldered to low resistance contact electrodes 44*a*, 44*b*, and 41*a* respectively in order to make operative circuit contacts to transistor 40*a*.

While only certain preferred features of the invention have been shown by way of illustration, many modifications will occur to those skilled in the art and it is, therefore, to be understood that the appended claims are intended to cover all such modifications as fall within the true spirit and scope of the invention.

What I claim as new and desire to secure by Letters Patent of the United States is:

1. The method of making a P–N junction semiconductor unit, which method comprises vaporizing and activator element of one conductivity inducing type, directing a beam of electrons through the vaporized activator element to ionize the vaporized element, and forming and directing a high velocity beam of said ionized vaporized element upon a semiconductor crystal selected from the group consisting of germanium and silicon of opposite conductivity type to convert a surface-adjacent region of the crystal receiving said ionized beam into said one conductivity type.

2. The method of claim 1 wherein the semiconductor crystal of one conductivity type constitutes an N-type germanium crystal and the activator element of opposite conductivity inducing type constitutes indium.

3. The method of claim 1 wherein the semiconductor crystal of one conductivity type constitutes a P-type germanium crystal, and the activator element of opposite conductivity inducing type constitutes arsenic.

4. The method of claim 1 wherein the semiconductor crystal of one conductivity type constitutes a P-type germanium crystal and the activator element of opposite conductivity inducing type constitutes antimony.

References Cited in the file of this patent

UNITED STATES PATENTS

| | | |
|---|---|---|
| 2,563,503 | Wallace | Aug. 7, 1951 |
| 2,597,028 | Pfann | May 20, 1952 |
| 2,666,814 | Shockley | Jan. 19, 1954 |
| 2,695,852 | Sparks | Nov. 30, 1954 |
| 2,709,232 | Thedieck | May 24, 1955 |
| 2,750,541 | Ohl | June 12, 1956 |

FOREIGN PATENTS

| | | |
|---|---|---|
| 840,418 | Germany | June 5, 1952 |
| 695,178 | Great Britain | Aug. 5, 1953 |